(12) United States Patent
Hoshino et al.

(10) Patent No.: US 10,745,507 B2
(45) Date of Patent: Aug. 18, 2020

(54) COLORING COMPOSITION, LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Wataru Hoshino, Minami-ashigara (JP); Yoshiaki Takada, Minami-ashigara (JP); Jyunko Ibaraki, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 140 days.

(21) Appl. No.: 16/058,166

(22) Filed: Aug. 8, 2018

(65) Prior Publication Data

US 2018/0346633 A1    Dec. 6, 2018

Related U.S. Application Data

(63) Continuation of application No. PCT/JP2017/009011, filed on Mar. 7, 2017.

(30) Foreign Application Priority Data

Mar. 8, 2016 (JP) ................. 2016-044908

(51) Int. Cl.
| | | |
|---|---|---|
| C08F 290/12 | (2006.01) |
| C08F 20/36 | (2006.01) |
| C08F 20/28 | (2006.01) |
| C09B 29/12 | (2006.01) |
| C09B 31/043 | (2006.01) |
| C09B 31/14 | (2006.01) |
| G02B 5/30 | (2006.01) |
| C09B 69/10 | (2006.01) |
| B29D 11/00 | (2006.01) |
| C09B 31/062 | (2006.01) |
| C09B 23/16 | (2006.01) |
| C08F 222/10 | (2006.01) |
| C08F 120/30 | (2006.01) |
| C08F 2/50 | (2006.01) |
| C08F 120/36 | (2006.01) |
| C09B 23/14 | (2006.01) |
| C08F 8/14 | (2006.01) |
| C08F 220/36 | (2006.01) |
| C08F 20/10 | (2006.01) |
| G02F 1/1335 | (2006.01) |
| C09D 133/14 | (2006.01) |
| C09B 62/465 | (2006.01) |
| H01L 51/52 | (2006.01) |
| H01L 27/32 | (2006.01) |
| G02F 1/139 | (2006.01) |

(52) U.S. Cl.
CPC ...... *C08F 290/126* (2013.01); *B29D 11/0073* (2013.01); *C08F 2/50* (2013.01); *C08F 8/14* (2013.01); *C08F 20/10* (2013.01); *C08F 20/28* (2013.01); *C08F 20/36* (2013.01); *C08F 120/30* (2013.01); *C08F 120/36* (2013.01); *C08F 220/36* (2013.01); *C08F 222/10* (2013.01); *C09B 23/143* (2013.01); *C09B 23/164* (2013.01); *C09B 29/12* (2013.01); *C09B 31/043* (2013.01); *C09B 31/062* (2013.01); *C09B 31/14* (2013.01); *C09B 62/465* (2013.01); *C09B 69/10* (2013.01); *C09B 69/106* (2013.01); *C09D 133/14* (2013.01); *G02B 5/30* (2013.01); *G02B 5/305* (2013.01); *G02F 1/1335* (2013.01); *C08F 220/365* (2020.02); *C08F 2800/20* (2013.01); *C08F 2810/30* (2013.01); *G02F 1/139* (2013.01); *G02F 1/133528* (2013.01); *H01L 27/322* (2013.01); *H01L 51/5281* (2013.01)

(58) Field of Classification Search
CPC ...... C08F 290/126; C08F 20/36; C08F 20/28; C09B 29/12; C09B 31/043; C09B 31/14; C09B 69/106; G02F 1/133528; G02B 5/305
USPC ..................................................... 428/522
See application file for complete search history.

(56) References Cited

U.S. PATENT DOCUMENTS

2005/0082513 A1* 4/2005 Seki ............... C09K 19/3852
                                                          252/299.01

FOREIGN PATENT DOCUMENTS

| JP | 2002-62425 A | | 2/2002 |
| JP | 2003-2927 A | | 1/2003 |
| JP | 2003002927 A | * | 1/2003 |
| JP | 2005-141206 A | | 6/2005 |
| JP | 2010-244038 A | | 10/2010 |

(Continued)

OTHER PUBLICATIONS

Translation of JP 2011-237513 (application 2010-107133), Nov. 24, 2011. (Year: 2011).*

(Continued)

*Primary Examiner* — Hui H Chin
(74) *Attorney, Agent, or Firm* — Birch, Stewart, Kolasch & Birch, LLP

(57) ABSTRACT

An object of the invention is to provide a coloring composition with which a light absorption anisotropic film maintaining an excellent dichroic ratio and having good pressing resistance can be formed, and a light absorption anisotropic film, a laminate, and an image display device using the coloring composition. A coloring composition according to the invention contains: a polymer compound having a repeating unit including a crosslinkable group and a mesogenic group in the same side chain, or a polymer compound separately having a repeating unit including a crosslinkable group in a side chain and a repeating unit including a mesogenic group in a side chain; and a dichroic dye compound.

20 Claims, No Drawings

(56) References Cited

FOREIGN PATENT DOCUMENTS

| JP | 2011-237513 | A |   | 11/2011 |
| JP | 2011237513 | A | * | 11/2011 |
| JP | 2013228706 | A | * | 11/2013 |

OTHER PUBLICATIONS

Translation of JP 2003-002927 (application 2001-183245), Jan. 8, 2003. (Year: 2003).*
Translation of JP 2013-228706 (application 2013-061521), Nov. 7, 2013. (Year: 2013).*
International Preliminary Report on Patentability and Written Opinion of the International Searching Authority(Forms PCT/IB/326, PCT/IB/373 and PCT/ISA/237), dated Sep. 20, 2018, for International Application No. PCT/JP2017/009011, with an English Translation of the Written Opinion.
International Search Report (Form PCT/ISA/210), dated Jun. 6, 2017, for corresponding International Application No. PCT/JP2017/009011, with an English translation.
Japanese Office Action for Japanese Application No. 2018-504514, dated Aug. 6, 2019, with an English translation.

* cited by examiner

COLORING COMPOSITION, LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2017/009011 filed on Mar. 7, 2017, which claims priority under 35 U.S.C. § 119(a) to Japanese Patent Application No. 2016-044908 filed on Mar. 8, 2016. The above application is hereby expressly incorporated by reference, in its entirety, into the present application.

BACKGROUND OF THE INVENTION

1. Field of the Invention

The present invention relates to a coloring composition, a light absorption anisotropic film, a laminate, and an image display device.

2. Description of the Related Art

In a case where an attenuation function, a polarization function, a scattering function, or a shielding function is required in relation to irradiated light including laser light and natural light, a device which is operated by a different principle for each function has been used. Therefore, products corresponding to the above-described functions have also been manufactured through a different manufacturing process for each function.

For example, in liquid crystal displays (LCDs), a linearly polarizing plate or a circularly polarizing plate is used to control optical activity or a birefringent property in display. In addition, in organic light emitting diodes (OLEDs), a circularly polarizing plate is also used to prevent external light from being reflected.

Iodine has been widely used as a dichroic substance in these polarizing plates (polarizing elements). However, a polarizing element using an organic dye as a dichroic substance instead of iodine has also been examined.

For example, in JP2011-237513A, "a light absorption anisotropic film including at least one kind of thermotropic liquid crystalline dichroic dye and at least one kind of thermotropic liquid crystalline polymer, in which the mass content of the thermotropic liquid crystalline dichroic dye in the light absorption anisotropic film is 30% or greater" is described (claim 1).

SUMMARY OF THE INVENTION

The inventors have examined the light absorption anisotropic film described in JP2011-237513A, and found that the light absorption anisotropic film has a good dichroic ratio, but depending on the kind of the thermotropic liquid crystalline polymer used for the formation of the light absorption anisotropic film, the color or optical performance of a pressed portion may change, and thus there is room for improvement in the pressing resistance.

Accordingly, an object of the invention is to provide a coloring composition with which a light absorption anisotropic film maintaining an excellent dichroic ratio and having good pressing resistance can be formed, and a light absorption anisotropic film, a laminate, and an image display device using the coloring composition.

After intensive studies for achieving the object, the inventors have found that a light absorption anisotropic film maintaining an excellent dichroic ratio and having good pressing resistance can be formed using, together with a dichroic dye compound, a specific polymer compound having a crosslinkable group and a predetermined mesogenic group in a repeating unit, and completed the invention.

That is, the inventors have found that the object can be achieved with the following configuration.

[1] A coloring composition comprising: a polymer compound having a repeating unit represented by Formula (1) to be described later or a polymer compound having both a repeating unit represented by Formula (2) to be described later and a repeating unit represented by Formula (3) to be described later; and a dichroic dye compound.

[2] The coloring composition according to [1], in which the polymer compound has a maximum absorption wavelength of 380 nm or less.

[3] The coloring composition according to [1] or [2], in which the dichroic dye compound includes at least one kind of dye compound having a maximum absorption wavelength within a wavelength range of 370 to 550 nm and at least one kind of dye compound having a maximum absorption wavelength within a wavelength range of 500 to 700 nm.

[4] The coloring composition according to any one of [1] to [3], in which the dichroic dye compound has a crosslinkable group.

[5] The coloring composition according to any one of [1] to [4], in which the content of the dichroic dye compound is 5 to 300 parts by mass with respect to 100 parts by mass of the polymer compound.

[6] The coloring composition according to any one of [1] to [5], in which the number of benzene rings included in the mesogenic group of the polymer compound is 3 or more.

[7] A light absorption anisotropic film which is formed using the coloring composition according to any one of [1] to [6].

[8] A laminate comprising: a base; and the light absorption anisotropic film according to [7] which is provided on the base.

[9] The laminate according to [8], further comprising: a λ/4 plate which is provided on the light absorption anisotropic film.

[10] An image display device comprising: the light absorption anisotropic film according to [7], or the laminate according to [8] or [9].

According to the invention, it is possible to provide a coloring composition with which a light absorption anisotropic film maintaining an excellent dichroic ratio and having good pressing resistance can be formed, and a light absorption anisotropic film, a laminate, and an image display device using the coloring composition.

DESCRIPTION OF THE PREFERRED EMBODIMENTS

Hereinafter, the invention will be described in detail.

The following description of constituent requirements is based on typical embodiments of the invention, but the invention is not limited thereto.

In this specification, a numerical value range expressed using "to" means a range including numerical values before and after "to" as a lower limit value and an upper limit value.

[Coloring Composition]

A coloring composition according to the invention contains a polymer compound (hereinafter, also abbreviated as "polymer compound A") having a repeating unit represented by Formula (1) to be described later, or a polymer compound (hereinafter, also abbreviated as "polymer compound B") having both a repeating unit represented by Formula (2) to be described later and a repeating unit represented by Formula (3) to be described later, and a dichroic dye compound.

Here, the polymer compound A is a polymer having a repeating unit including a crosslinkable group and a mesogenic group in the same side chain as shown in Formula (1) to be described later, and the polymer compound B is a polymer separately having a repeating unit including a crosslinkable group in a side chain and a repeating unit including a mesogenic group in a side chain as shown in Formulae (2) and (3) to be described later.

The coloring composition according to the invention may contain any one of the polymer compound A and the polymer compound B, but it is obvious that the invention also includes an aspect in which the coloring composition contains both the polymer compound A and the polymer compound B.

Due to the polymer compound A or the polymer compound B contained together with the dichroic dye compound in the coloring composition according to the invention, a light absorption anisotropic film to be formed maintains an excellent dichroic ratio and has good pressing resistance.

The detailed reason for this is not clear, but is presumed as follows by the inventors.

That is, it is thought that due to a crosslinkable group and a predetermined mesogenic group having an azo group or the like included in a side chain of a repeating unit, the dichroic dye compound can be cured while being maintained to be highly aligned.

As described above, with the coloring composition according to the invention, a light absorption anisotropic film to be formed maintains an excellent dichroic ratio and has good pressing resistance, and thus continuous production based on a roll form becomes easier, and laminating a functional layer on the light absorption anisotropic film becomes easier. Moreover, there is an effect that the lamination of the light absorption anisotropic film on a display device becomes easier, and thus the coloring composition is useful.

Hereinafter, essential components and optional components contained in the coloring composition according to the invention will be described.

[Polymer Compound]

The polymer compound contained in the coloring composition according to the invention is a polymer compound having a repeating unit represented by Formula (1) or a polymer compound having both a repeating unit represented by Formula (2) and a repeating unit represented by Formula (3).

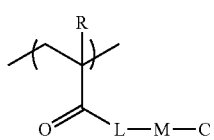

(1)

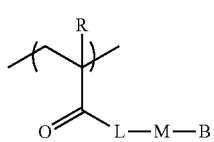

(2)

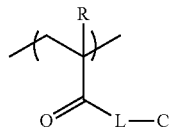

(3)

Here, in Formula (1), R represents a hydrogen atom or a methyl group, L represents a single bond or a divalent linking group, C represents a crosslinkable group, and M represents a mesogenic group represented by Formula (1-1).

In Formula (2), R, L, and M each represent the same atom, group, or bond as R, L, and M in Formula (1). B represents a hydrogen atom, a halogen atom, a cyano group, an alkyl group, an alkoxy group, an amino group, an oxycarbonyl group, an acyloxy group, an acylamino group, an alkoxycarbonylamino group, a sulfonylamino group, a sulfamoyl group, a carbamoyl group, an alkylthio group, a sulfonyl group, a sulfinyl group, or a ureido group.

In Formula (3), R, L, and C each represent the same atom, group, or bond as R, L, and C in Formula (1).

$$*\!-\!\!\left(\!Ar^{11}\!-\!L^{11}\!\right)_{\!m1}\!\!-\!Y\!-\!\!\left(\!Ar^{12}\!-\!L^{12}\!\right)_{\!m2}\!\!-\!* \qquad (1\text{-}1)$$

Here, in Formula (1-1), $Ar^{11}$ and $Ar^{12}$ each independently represent a phenylene group or a biphenylene group which may have a substituent, $L^{11}$ and $L^{12}$ each independently represent a single bond or a divalent linking group, Y represents an azo group, an imino group, a —OCO—CH=CH— group, or a —CH=CH—$CO_2$— group, and m1 and m2 each independently represent an integer of 1 to 3.

In a case where m1 is an integer of 2 to 3, plural $Ar^{11}$'s may be the same or different, and plural $L^{11}$'s may be the same or different.

In a case where m2 is an integer of 2 or 3, plural $Ar^{12}$'s may be the same or different, and plural $L^{12}$'s may be the same or different.

The divalent linking group represented by L in Formulae (1) to (3) will be described.

Examples of the divalent linking group include —O—, —S—, —COO—, —OCO—, —O—CO—O—, —$NR^N$CO—, —$CONR^N$—, an alkylene group, and a divalent group obtained by combining two or more of the above groups. RN represents a hydrogen atom or an alkyl group.

Among these, a divalent group obtained by combining an alkylene group and at least one group selected from the group consisting of —O—, —COO—, and —OCO— is preferable.

The number of carbon atoms of the alkylene group is preferably 2 to 16 from the viewpoint that the polymer compound has liquid crystallinity.

The crosslinkable group represented by C in Formula (1) or (3) will be described.

Examples of the crosslinkable group include polymerizable groups described in paragraphs [0040] to [0050] of JP2010-244038A. Among these, an acryloyl group, a methacryloyl group, an epoxy group, an oxetanyl group, or a styryl group is preferable, and an acryloyl group or a methacryloyl group (hereinafter, also abbreviated as "(meth) acryloyl group") is more preferable from the viewpoint of reactivity and synthesis suitability.

The mesogenic group, represented by M in Formula (1) or (2), represented by Formula (1-1) will be described. In Formula (1-1), * represents a bonding position with L or C in Formula (1), and in Formula (2), * represents a bonding position with L or B in Formula (2).

In Formula (1-1), $Ar^{11}$ and $Ar^{12}$ each independently represent a phenylene group or a biphenylene group which may have a substituent.

Here, the substituent is not particularly limited, and examples thereof include a halogen atom, an alkyl group, an alkyloxy group, an alkylthio group, an oxycarbonyl group, a thioalkyl group, an acyloxy group, an acylamino group, an alkoxycarbonylamino group, a sulfonylamino group, a sulfamoyl group, a carbamoyl group, sulfinyl group, and a ureido group.

In Formula (1-1), $L^{11}$ and $L^{12}$ each independently represent a single bond or a divalent linking group.

Here, examples of the divalent linking group include —O—, —S—, —COO—, —OCO—, —O—CO—O—, —$NR^N$CO—, —CONR$^N$—, an alkylene group, and a divalent group obtained by combining two or more of the above groups. $R^N$ represents a hydrogen atom or an alkyl group.

In Formula (1-1), Y represents an azo group, an imino group, a —OCO—CH=CH— group, or a —CH=CH—$CO_2$— group.

Among these, an azo group is preferable since the dichroic ratio of the light absorption anisotropic film is further improved.

In Formula (1-1), m1 and m2 each independently represent an integer of 1 to 3.

Here, a total of m1 and m2 is preferably an integer of 2 to 5, and more preferably an integer of 2 to 4 from the viewpoint that the polymer compound exhibits liquid crystallinity.

B in Formula (2) will be described.

B represents a hydrogen atom, a halogen atom, a cyano group, an alkyl group, an alkoxy group, an amino group, an oxycarbonyl group, an alkoxycarbonyl group, an acyloxy group, a (poly)alkyleneoxy group, an acylamino group, an alkoxycarbonylamino group, a sulfonylamino group, a sulfamoyl group, a carbamoyl group, an alkylthio group, a sulfonyl group, a sulfinyl group, or a ureido group.

Among these, a cyano group, an alkyl group, an alkoxy group, an oxycarbonyl group, an alkoxycarbonyl group, a (poly)alkyleneoxy group, or an alkylthio group is preferable, and an alkyl group, an alkoxy group, or a (poly)alkyleneoxy group is more preferable from the viewpoint of the exhibition of the liquid crystallinity of the polymer compound or the adjustment of a phase transition temperature and from the viewpoint of solubility.

Among B's, the number of carbon atoms of a hydrogen atom, a halogen atom, or an alkyl group or the like other than a cyano group is preferably 1 to 20, and more preferably 1 to 11 from the viewpoint of the exhibition of the liquid crystallinity of the polymer compound or the adjustment of a phase transition temperature and from the viewpoint of solubility.

In the invention, the polymer compound is preferably a liquid crystalline polymer since the dichroic ratio of the light absorption anisotropic film is further improved.

Here, the term liquid crystalline may refer to the fact that the polymer is either nematic or smectic, but it is preferable that the polymer exhibit at least a nematic property.

The temperature range in which the nematic phase is exhibited is preferably a room temperature (23° C.) to 300° C., and from the viewpoint of handling or manufacturing suitability, preferably 50° C. to 200° C.

In the invention, in a case where a polymer compound having both the repeating unit represented by Formula (2) and the repeating unit represented by Formula (3) is used, the ratio between the repeating unit represented by Formula (2) and the repeating unit represented by Formula (3) is preferably within a range of 99.9:0.1 to 20:80, more preferably within a range of 99.5:0.5 to 35:65, and even more preferably within a range of 99:1 to 50:50 in terms of molar ratio.

Furthermore, in the invention, the weight average molecular weight (Mw) of the polymer compound is preferably 1,000 to 100,000, and more preferably 2,000 to 60,000. The number average molecular weight (Mn) is preferably 500 to 80,000, and more preferably 1,000 to 30,000.

Here, the weight average molecular weight and the number average molecular weight are values measured through gel permeation chromatography (GPC).

Solvent (eluent): Tetrahydrofuran
Device Name: TOSOH HLC-8220GPC
Column: Three columns of TOSOH TSKgel Super HZM-H (4.6 mm×15 cm) are connected and used.
Column Temperature: 25° C.
Sample concentration: 0.1 mass %
Flow Rate: 0.35 ml/min
Calibration Curve: A calibration curve obtained by 7 samples of TSK standard polystyrene manufactured by TOSOH Corporation, Mw=2,800,000 to 1,050 (Mw/Mn=1.03 to 1.06) is used.

In the invention, the maximum absorption wavelength of the polymer compound is preferably 380 nm or less since the alignment of the dichroic dye compound is more easily maintained in a visible light region due to small absorption in the visible light region.

In addition, in the invention, the number of benzene rings included in the mesogenic group of the polymer compound is preferably 3 or more, and more preferably 4 or more since the dichroic ratio of the light absorption anisotropic film is further improved.

Specific examples of the polymer compound having a repeating unit represented by Formula (1) among the polymer compounds contained in the coloring composition according to the invention include polymer compounds represented by the following structural formulae. In the following structural formulae, R represents a hydrogen atom or a methyl group.

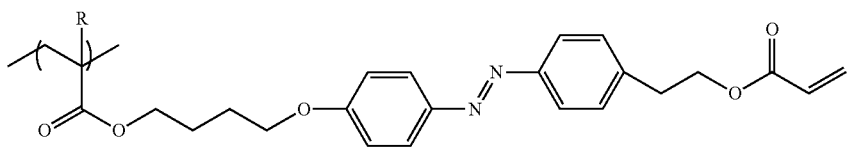

-continued
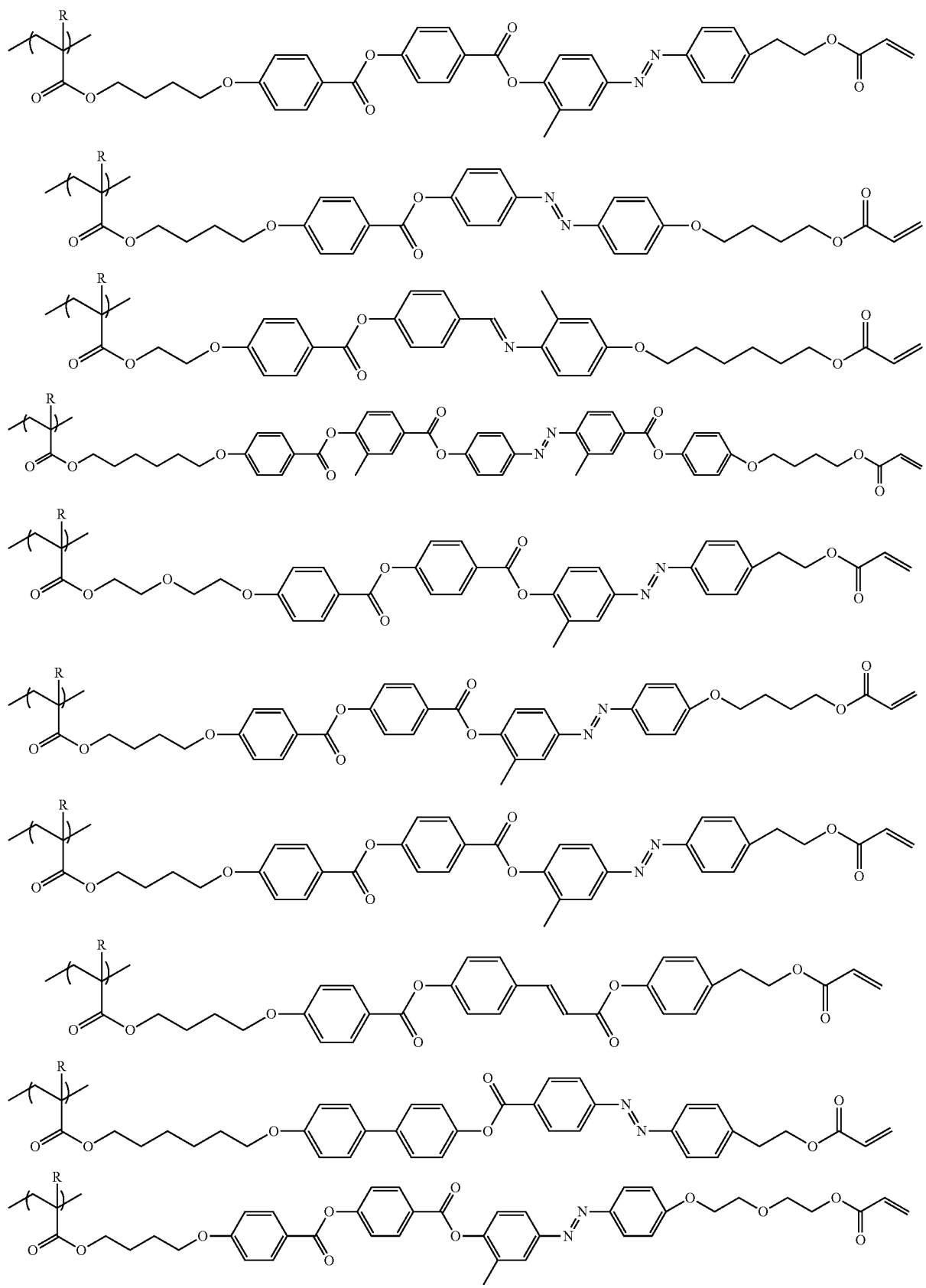

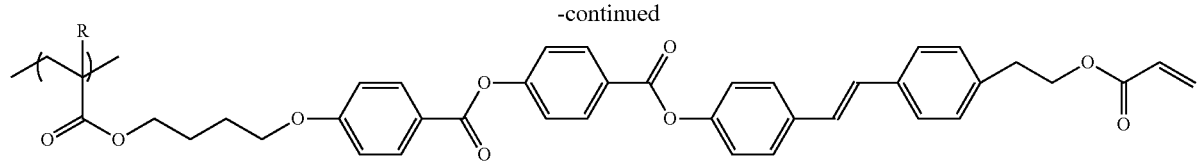

Specific examples of the repeating unit represented by Formula (2) in the polymer compound having both the repeating unit represented by Formula (2) and the repeating unit represented by Formula (3) among the polymer compounds contained in the coloring composition according to the invention include repeating units represented by the following structural formulae. In the following structural formulae, R represents a hydrogen atom or a methyl group.

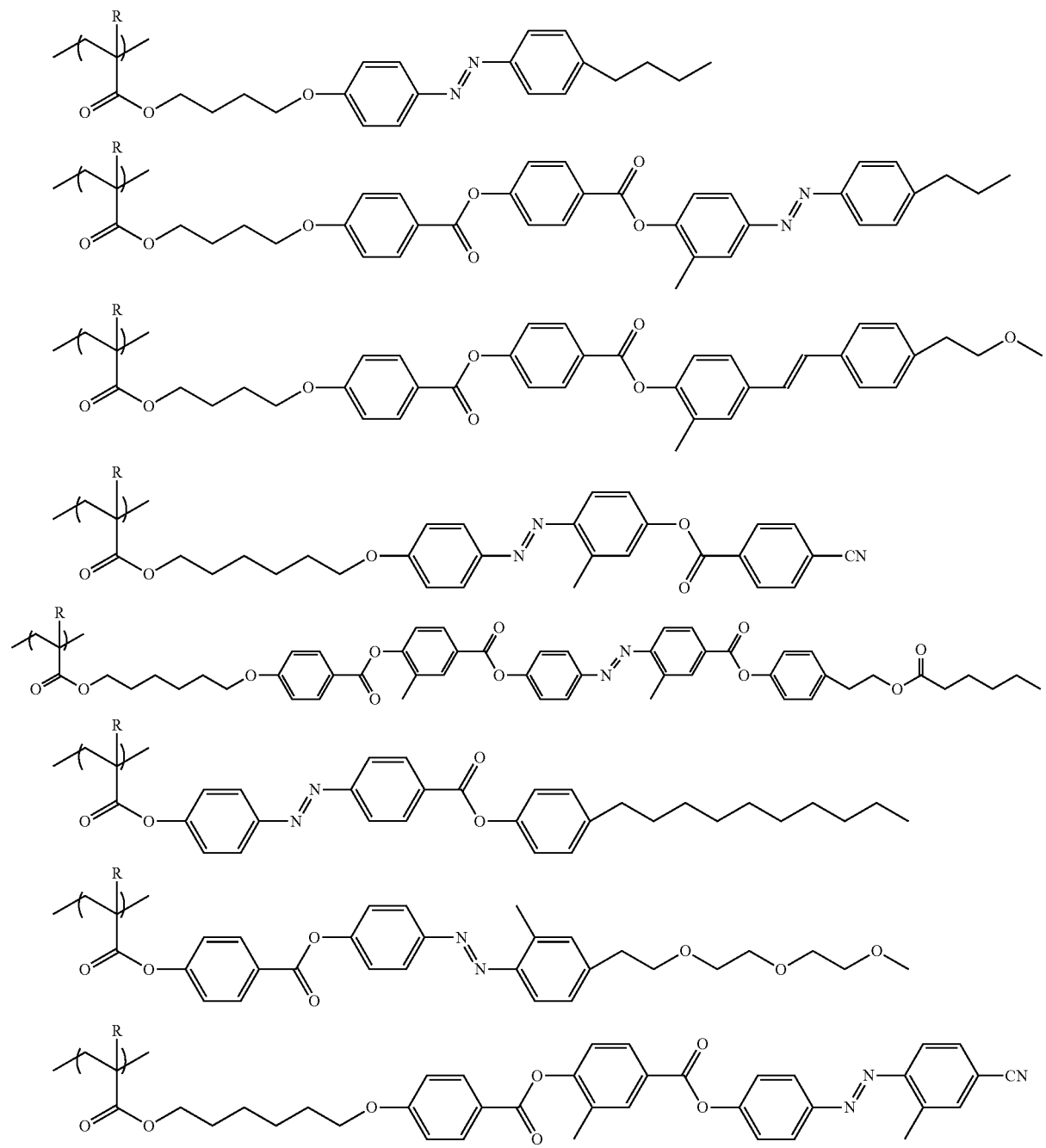

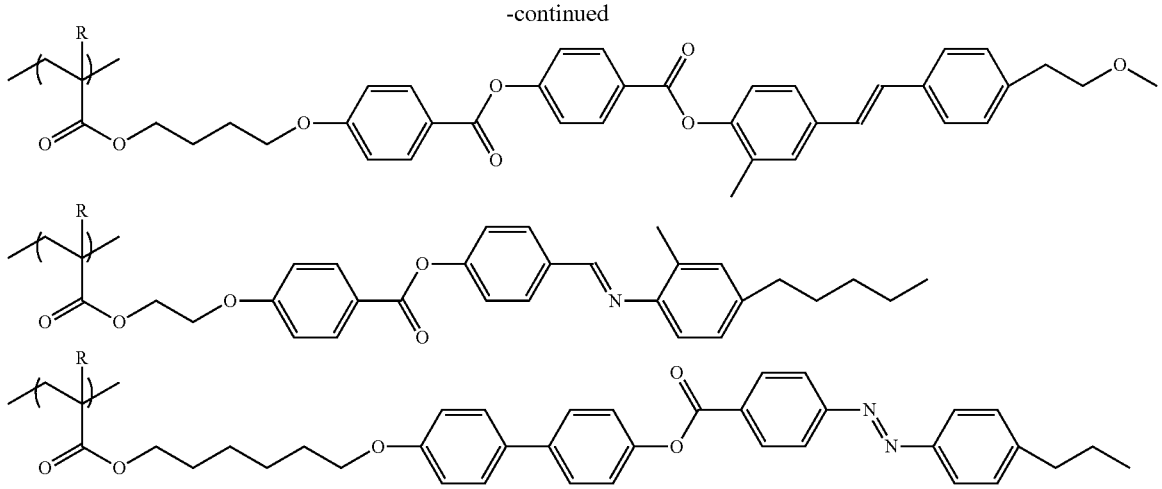

Specific examples of the repeating unit represented by Formula (3) in the polymer compound having both the repeating unit represented by Formula (2) and the repeating unit represented by Formula (3) include repeating units represented by the following structural formulae. In the following structural formulae, R represents a hydrogen atom or a methyl group.

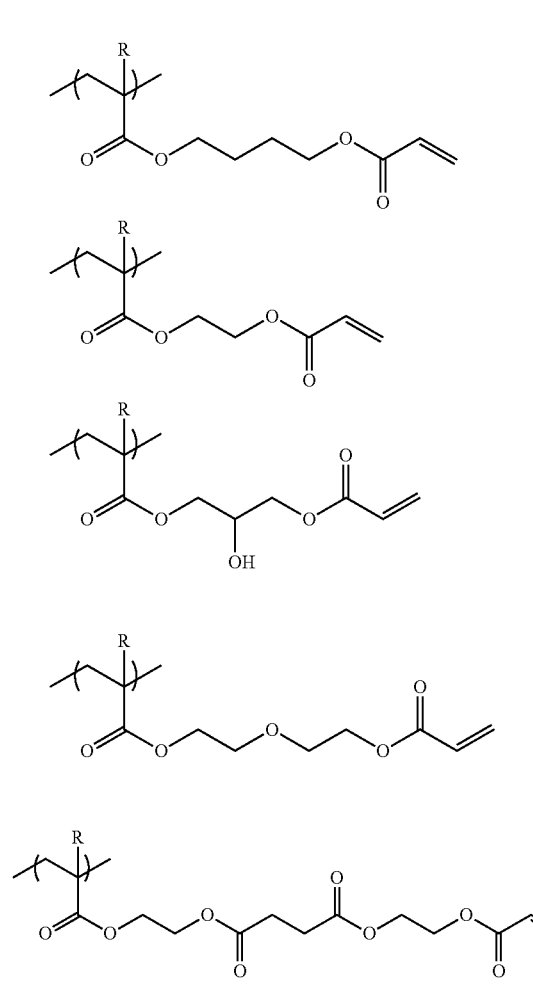

[Dichroic Dye Compound]

The dichroic dye compound contained in the coloring composition according to the invention is not particularly limited, and a conventionally known dichroic dye can be used.

Specific examples thereof include materials in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-14883A, paragraphs [0012] to [0029] of JP2013-109090A, paragraphs [0009] to [0017] of JP2013-101328A, paragraphs [0051] to [0065] of JP2013-37353A, paragraphs [0049] to [0073] of JP2012-63387A, paragraphs [0016] to [0018] of JP1999-305036A (JP-H11-305036A), paragraphs [0009] to [0011] of JP2001-133630A, and paragraphs [0030] to [0169] of JP2011-215337A.

In the invention, two or more kinds of dichroic dye compounds may be used in combination. For example, from the viewpoint of making the color of the light absorption anisotropic film nearly black, at least one kind of dye compound having a maximum absorption wavelength within a wavelength range of 370 to 550 nm and at least one kind of dye compound having a maximum absorption wavelength within a wavelength range of 500 to 700 nm are preferably used in combination.

In the invention, the dichroic dye compound preferably has a crosslinkable group since the pressing resistance is further improved.

Specific examples of the crosslinkable group include a (meth)acryloyl group, an epoxy group, an oxetanyl group, and a styryl group, and among these, a (meth)acryloyl group is preferable.

In the invention, the content of the dichroic dye compound is preferably 5 to 400 parts by mass, more preferably 20 to 300 parts by mass, and even more preferably 20 to 200 parts by mass with respect to 100 parts by mass of the polymer compound from the viewpoint of an improvement in the balance between the alignment degree and the uniformity of the light absorption anisotropic film.

[Solvent]

The coloring composition according to the invention preferably contains a solvent from the viewpoint of workability or the like.

Examples of the solvent include organic solvents such as ketones (for example, acetone, 2-butanone, methyl isobutyl ketone, cyclopentanone, and cyclohexanone), ethers (for example, dioxane, tetrahydrofuran, and cyclopentyl methyl ether), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane (chloroform), dichloroethane, dichlorobenzene, and chlorotoluene), esters (for example, methyl acetate, ethyl acetate, and butyl acetate), alcohols (for example, ethanol, isopropanol, butanol, and cyclohexanol), cellosolves (for example, methyl cellosolve, ethyl cellosolve, and 1,2-dimethoxyethane), cellosolve acetates, sulfoxides (for example, dimethyl sulfoxide), amides (for example, dimethylformamide and dimethylacetamide), and heterocyclic compounds (for example, pyridine), and water. These solvents may be used alone or in combination of two or more kinds thereof.

Among these solvents, organic solvents are preferably used, and halogenated carbons or ketones are more preferably used.

In a case where the coloring composition according to the invention contains a solvent, the content of the solvent is preferably 70 to 99.5 mass %, more preferably 80 to 99 mass %, and even more preferably 85 to 97 mass % with respect to the total mass of the coloring composition.

[Interface Improver]

The coloring composition according to the invention preferably contains an interface improver. Due to the interface improver contained, the smoothness of the coating surface is improved and the alignment degree is improved. Otherwise, cissing and unevenness are suppressed, and thus an improvement in the in-plane uniformity is anticipated.

As the interface improver, a material making the polymer compound horizontal on the coating surface side is preferable, and compounds (horizontal alignment agents) described in paragraphs [0253] to [0293] of JP2011-237513A can be used.

In a case where the coloring composition according to the invention contains an interface improver, the content of the interface improver is preferably 0.001 to 5 parts by mass, and more preferably 0.01 to 3 parts by mass with respect to a total of 100 parts by mass of the dichroic dye compound and the liquid crystalline compound in the coloring composition.

[Polymerization Initiator]

The coloring composition used in the invention preferably contains a polymerization initiator.

The polymerization initiator is not particularly limited, and a photosensitive compound, that is, a photopolymerization initiator is preferable.

As the photopolymerization initiator, various kinds of compounds can be used with no particular limitation. Examples of the photopolymerization initiator include α-carbonyl compounds (the specifications of U.S. Pat. No. 2,367,661A and U.S. Pat. No. 2,367,670A), acyloin ethers (the specification of U.S. Pat. No. 2,448,828A), aromatic acyloin compounds substituted by α-hydrocarbon (the specification of U.S. Pat. No. 2,722,512A), polynuclear quinone compounds (the specifications of U.S. Pat. No. 3,046,127A and U.S. Pat. No. 2,951,758A), combinations of triarylimidazole dimers and p-aminophenyl ketones (the specification of U.S. Pat. No. 3,549,367A), acridine and phenazine compounds (the specifications of JP1985-105667A (JP-S60-105667A) and U.S. Pat. No. 4,239,850A), oxadiazole compounds (the specification of U.S. Pat. No. 4,212,970A), and acylphosphine oxide compounds (JP1988-40799B (JP-S63-40799B), JP1993-29234B (JP-H5-29234B), JP1998-95788B (JP-H10-95788B), and JP1998-29997B (JP-H10-29997B)).

A commercially available product can also be used as the photopolymerization initiator, and examples thereof include IRGACURE 184, IRGACURE 907, IRGACURE 369, IRGACURE 651, IRGACURE 819, and IRGACURE OXE-01 manufactured by BASF SE.

In a case where the coloring composition according to the invention contains a polymerization initiator, the content of the polymerization initiator is preferably 0.01 to 30 parts by mass, and more preferably 0.1 to 15 parts by mass with respect to a total of 100 parts by mass of the dichroic dye compound and the liquid crystalline compound in the coloring composition. In a case where the content of the polymerization initiator is 0.01 parts by mass or greater, the durability of the light absorption anisotropic film is improved, and in a case where the content of the polymerization initiator is 30 parts by mass or less, the alignment of the light absorption anisotropic film is improved.

[Light Absorption Anisotropic Film]

A light absorption anisotropic film according to the invention is formed using the above-described coloring composition according to the invention.

Examples of the method of manufacturing the light absorption anisotropic film according to the invention include a method including, in order, a step of forming a coating film by applying the coloring composition to a base (hereinafter, also referred to as "coating film forming step") and a step of aligning a dichroic dye compound contained in the coating film (hereinafter, also referred to as "alignment step").

Hereinafter, the steps of the method of manufacturing the light absorption anisotropic film according to the invention will be described.

(Coating Film Forming Step)

The coating film forming step is a step of forming a coating film by applying the coloring composition to a base.

By using a coloring composition containing the above-described solvent, or a liquid material such as a molten liquid obtained by heating the coloring composition, the coloring composition is easily applied to the base.

Examples of the method of applying the coloring composition include known methods such as a roll coating method, a gravure printing method, a spin coating method, a wire bar coating method, an extrusion coating method, a direct gravure coating method, a reverse gravure coating method, a die coating method, a spray method, and an ink jet method.

In this aspect, an example has been given in which the coloring composition is applied to the base, but the invention is not limited thereto. For example, the coloring composition may be applied to an alignment film provided on the base. Details of the base and the alignment film will be described later.

[Alignment Step]

The alignment step is a step of aligning a dichroic dye compound contained in the coating film. Thus, a light absorption anisotropic film is obtained.

The alignment step may have a drying treatment. Through the drying treatment, a component such as a solvent can be removed from the coating film. The drying treatment may be performed by a method of leaving the coating film for a predetermined time at room temperature (for example, natural drying), or a heating and/or air blowing method.

Here, the dichroic dye compound contained in the coloring composition may be aligned by the above-described coating film forming step or drying treatment. For example, in an aspect in which the coloring composition is prepared as a coating liquid containing a solvent, the coating film is dried to remove the solvent from the coating film, and thus a coating film having light absorption anisotropy (that is, light absorption anisotropic film) is obtained.

The alignment step preferably has a heating treatment. Accordingly, the dichroic dye compound contained in the coating film can be aligned, and thus the coating film after the heating treatment can be preferably used as a light absorption anisotropic film.

The heating treatment is preferably performed at 10° C. to 250° C., and more preferably at 25° C. to 190° C. in view of manufacturing suitability or the like. The heating time is preferably 1 to 300 seconds, and more preferably 1 to 60 seconds.

The alignment step may have a cooling treatment to be performed after the heating treatment. The cooling treatment is a treatment for cooling the coating film after the heating to about room temperature (20° C. to 25° C.). Accordingly, the alignment of the dichroic dye compound contained in the coating film can be fixed. The cooling means is not particularly limited, and the cooling can be performed by a known method.

By the above steps, a light absorption anisotropic film can be obtained.

In this aspect, examples of the method of aligning the dichroic dye compound contained in the coating film include the drying treatment and the heating treatment, but are not limited thereto, and a known alignment treatment can be used.

[Other Steps]

The method of manufacturing a light absorption anisotropic film may have a step of curing the light absorption anisotropic film (hereinafter, also referred to as "curing step") after the alignment step.

The curing step is performed by, for example, heating and/or light irradiation (exposure). Among these, light irradiation is preferably performed to conduct the curing step.

As the light source used for curing, various light sources can be used such as infrared rays, visible light, and ultraviolet rays, and ultraviolet rays are preferable. In the curing, ultraviolet rays may be applied during heating, or may be applied via a filter which transmits only a component with a specific wavelength.

In addition, the exposure may be performed under a nitrogen atmosphere. In a case where the light absorption anisotropic film is cured by radical polymerization, inhibition of the polymerization by oxygen is reduced, and thus the exposure is preferably performed under a nitrogen atmosphere.

The film thickness of the light absorption anisotropic film is preferably 0.1 to 5.0 μm, and more preferably 0.3 to 1.5 μm. Although depending on the concentration of the dichroic dye compound in the coloring composition, a light absorption anisotropic film having an excellent absorbance is obtained in a case where the film thickness is 0.1 μm or greater, and a light absorption anisotropic film having an excellent transmittance is obtained in a case where the film thickness is 5.0 μm or less.

[Laminate]

A laminate according to the invention has a base and a light absorption anisotropic film according to the invention which is provided on the base.

The laminate according to the invention may have a λ/4 plate on the light absorption anisotropic film.

The laminate according to the invention may further have an alignment film between the base and the light absorption anisotropic film.

Hereinafter, the constituent layers of the laminate according to the invention will be described.

[Base]

The base can be selected in accordance with usage of the light absorption anisotropic film, and examples thereof include glass and a polymer film. The light transmittance of the base is preferably 80% or greater.

In a case where a polymer film is used as the base, an optically isotropic polymer film is preferably used. As specific examples and preferable aspects of the polymer, those described in a paragraph [0013] of JP2002-22942A can be applied. In addition, even a conventionally known polymer such as polycarbonate or polysulfone in which birefringence is likely to be developed can also be used by reducing the developability through molecular modification described in WO2000/26705A.

[Light Absorption Anisotropic Film]

Since the light absorption anisotropic film is as described above, the description thereof will be omitted.

[λ/4 Plate]

The "λ/4 plate" is a plate having a λ/4 function, and is specifically, a plate having a function of converting linearly polarized light with a specific wavelength into circularly polarized light (or converting circularly polarized light into linearly polarized light).

For example, in an aspect in which the λ/4 plate has a single layer structure, specific examples of the plate include a retardation film in which an optically anisotropic layer having a λ/4 function is provided on a stretched polymer film or a support. In an aspect in which the λ/4 plate has a multilayered structure, specific examples of the plate include a broadband λ/4 plate having a laminate of a λ/4 plate and a λ/2 plate.

The λ/4 plate and the light absorption anisotropic film may be provided in contact with each other, or another layer may be provided between the λ/4 plate and the light absorption anisotropic film. Examples of the layer include a pressure sensitive layer and an adhesive layer.

[Alignment Film]

The laminate according to the invention may have an alignment film between the base and the light absorption anisotropic film.

As the alignment film, any layer may be used as long as it allows the dichroic dye compound contained in the coloring composition according to the invention to have a desired alignment state.

The alignment film can be provided by means of a rubbing treatment on the film surface with an organic compound (preferably a polymer), oblique vapor deposition of an inorganic compound, forming a layer having microgrooves, or accumulation of an organic compound (for example, ω-tricosanoic acid, dioctadecylmethylammonium chloride or methyl stearate) by the Langmure-Blogette method (LB film). Furthermore, there have been known alignment films having an aligning function imparted thereto by applying an electrical field, applying a magnetic field, or light irradiation. In the invention, among these, an alignment film formed by a rubbing treatment is preferable in view of easy control of a pretilt angle of the alignment film, and a photo-alignment film formed by light irradiation is also preferable in view of alignment uniformity.

<Rubbed Alignment Film>

The polymer material used for an alignment film formed by a rubbing treatment is described in many literatures, and many commercially available products are available. In the invention, polyvinyl alcohol or polyimide, or derivatives thereof can be preferably used. Regarding the alignment film, the description in the 24th line on page 43 to 8th line on page 49 in WO2001/88574A1 can be referred to. The thickness of the alignment film is preferably 0.01 to 10 μm, and more preferably 0.01 to 1 μm.

<Photo-Alignment Film>

The photo-alignment material used for an alignment film formed by light irradiation is described in many literatures. In the invention, preferable examples thereof include azo compounds described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignment units described in JP2002-265541A and JP2002-317013A, photocrosslinkable silane derivatives described in JP4205195B and JP4205198B, and photocrosslinkable polyimides, polyamides, and esters described in JP2003-520878A, JP2004-529220A, and JP4162850B. Azo compounds, photocrosslinkable polyimides, polyamides, and esters are more preferable.

To a photo-alignment film formed from the above-described material, linearly polarized light or unpolarized light is applied to manufacture a photo-alignment film.

In this specification, the "linearly polarized light irradiation" and the "unpolarized light irradiation" are operations for causing a photoreaction to the photo-alignment material. The wavelength of the light used is not particularly limited as long as the wavelength varies depending on the photo-alignment material used and is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and an YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction perpendicular or oblique to the alignment film surface is employed. Although the incidence angle of the light varies depending on the photo-alignment material, the incidence angle is preferably 0° to 90°, and more preferably 40° to 90°.

In a case where unpolarized light is used, the alignment film is irradiated with unpolarized light from an oblique direction. The incidence angle of the light is preferably 10° to 80°, more preferably 20° to 60°, and even more preferably 30° to 50°.

The irradiation time is preferably 1 minute to 60 minutes, and more preferably 1 minute to 10 minutes.

In a case where patterning is required, a method of performing light irradiation using a photomask as many times as necessary for pattern formation, or a pattern writing method using laser beam scanning can be employed.

[Usage]

The laminate according to the invention can be used as a polarizing element (polarizing plate). For example, it can be used as a linearly polarizing plate or a circularly polarizing plate.

In a case where the laminate according to the invention has no optically anisotropic layer such as the λ/4 plate, the laminate can be used as a linearly polarizing plate.

In a case where the laminate according to the invention has the λ/4 plate, the laminate can be used as a circularly polarizing plate.

[Image Display Device]

An image display device according to the invention has the above-described light absorption anisotropic film or the above-described laminate.

The display element used for the image display device according to the invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the invention, a liquid crystal display device using a liquid crystal cell as a display element, or an organic EL display device using an organic EL display panel as a display element is preferable, and a liquid crystal display device is more preferable.

[Liquid Crystal Display Device]

A liquid crystal display device as an example of the image display device according to the invention preferably has an aspect in which it has the above-described light absorption anisotropic film and a liquid crystal cell. More preferably, the liquid crystal display device has the above-described laminate (but including no λ/4 plate) and a liquid crystal cell.

In the invention, it is preferable that the light absorption anisotropic film (laminate) according to the invention be used as a polarizing element on the front side among light absorption anisotropic films (laminates) to be provided on both sides of a liquid crystal cell, and it is more preferable that the light absorption anisotropic film (laminate) according to the invention be used as polarizing elements on the front side and the rear side.

Hereinafter, the liquid crystal cell of the liquid crystal display device will be described in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode, but is not limited thereto.

In a TN mode liquid crystal cell, with no application of a voltage, rod-like liquid crystalline molecules are substantially horizontally aligned, and twist-aligned by 60° to 120°. The TN mode liquid crystal cell is most frequently used as a color thin film transistor (TFT) liquid crystal display device, and is described in many literatures.

In a VA mode liquid crystal cell, rod-like liquid crystalline molecules are substantially vertically aligned with no application of a voltage. The VA mode liquid crystal cell includes (1) a narrowly-defined VA mode liquid crystal cell in which rod-like liquid crystalline molecules are substantially vertically aligned with no application of a voltage, and are substantially horizontally aligned with the application of a voltage (described in JP1990-176625A (JP-H2-176625A)), (2) a (MVA mode) liquid crystal cell in which the VA mode is made into multi-domains in order to expand the viewing angle (described in SID97, Digest of tech. Papers (proceedings) 28 (1997) 845), (3) an (n-ASM mode) liquid crystal cell in which rod-like liquid crystalline molecules are substantially vertically aligned with no application of a voltage, and are twisted in multi-domains with the application of a voltage (described in the proceedings 58 and 59 of Japanese Liquid Crystal Conference (1998)), and (4) a SURVIVAL mode liquid crystal cell (announced at LCD internal 98). In addition, the VA mode liquid crystal cell may be any one of a patterned vertical alignment (PVA) type, an optical alignment type, and a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. A method of improving the viewing angle by reducing light leakage caused when a black image is displayed in an oblique direction using an optical compensation sheet is disclosed by JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

An organic EL display device as an example of the image display device according to the invention preferably has an aspect in which it has a light absorption anisotropic film, a λ/4 plate, and an organic EL display panel in this order from the visual recognition side.

More preferably, the organic EL display device has the above-described laminate having a λ/4 plate and an organic EL display panel in this order from the visual recognition side. In this case, the laminate has a base, an alignment film to be provided as necessary, a light absorption anisotropic film, and a λ/4 plate disposed in this order from the visual recognition side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the invention will be more specifically described based on examples. Materials, used amounts, ratios, treatment contents, treatment procedures, and the like shown in the following examples are able to be properly changed without departing from the gist of the invention. Therefore, the range of the invention will not be restrictively interpreted by the following examples.

Synthesis Example 1

[Synthesis of Polymer Compound P1]

A polymer compound P1 was synthesized in accordance with the following steps 1 to 3.

<Step 1>

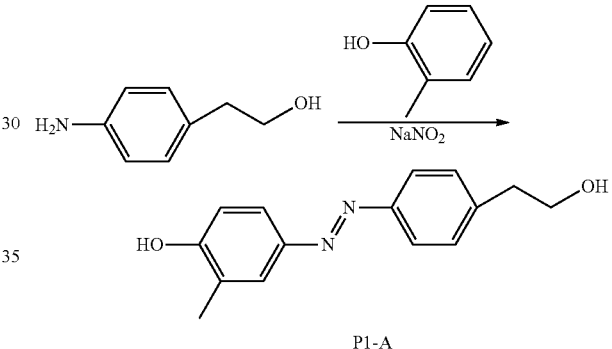

P1-A

A solution obtained at an external temperature of 0° C. by dissolving 20 g of 4-(2-hydroxyethyl)-aniline in 37 mL of a concentrated hydrochloric acid and 300 mL of water was stirred for 30 minutes. The internal temperature was maintained at 10° C. or lower at an external temperature of 0° C., and to the obtained solution, a solution obtained by dissolving 10.4 g of sodium nitrite in 80 mL of water was added dropwise. The resulting solution was stirred for 20 minutes at an internal temperature of 10° C. or lower, and a diazonium solution was prepared.

In addition, 16.2 g of o-methylphenol was added dropwise to a solution obtained by dissolving 18.6 g of sodium hydroxide in 500 mL of water, and was stirred for 10 minutes at an external temperature of 0° C. to prepare a coupler solution.

Next, the diazonium solution prepared as described above was added dropwise to the prepared coupler solution at an internal temperature maintained at 10° C. or lower. After the end of the dropwise addition, the obtained solution was stirred for 1 hour at room temperature.

Next, using a diluted hydrochloric acid aqueous solution, neutralization was performed until the pH of the obtained solution was 8 to 9, and a solid was precipitated. The precipitated solid was filtered out and washed with water. Then, the solid was dried at 40° C., and 35 g of a yellow solid P1-A was obtained.

<Step 2>

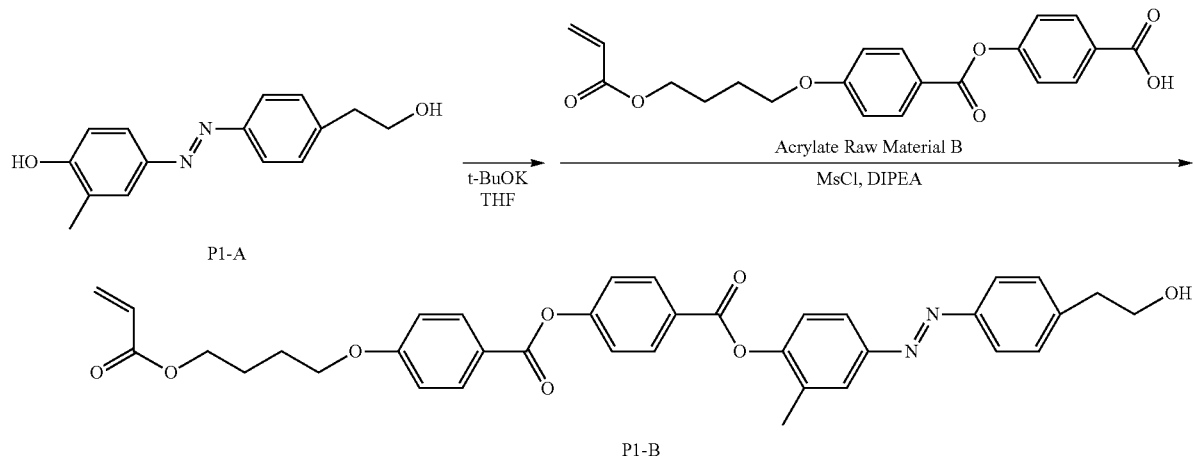

35 g of an acrylate raw material B was dissolved in 400 mL of a tetrahydrofuran (THF), and 10.66 g of methanesulfonyl chloride was added thereto. The obtained solution was stirred for 5 minutes at an external temperature of 0° C., and 12.03 g of diisopropylethylamine was added dropwise at an internal temperature maintained at 10° C. or lower. Furthermore, the obtained solution was stirred for 30 minutes at an internal temperature of 10° C. or lower, and an acrylate raw material solution was prepared.

Next, 11.36 g of t-butoxy potassium and 200 mL of THF were stirred with the obtained solution at an external temperature of 0° C., and a solution obtained by dissolving 19.88 g of the yellow solid P1-A in 200 mL of THF was added dropwise at an internal temperature maintained at 10° C. or lower. The obtained reaction liquid was stirred for 1 hour at room temperature. Then, 100 mL of methanol and 1,000 mL of water were added for crystallization. The obtained solid was dissolved in 500 mL of ethyl acetate at an external temperature of 80° C., 550 mL of n-hexane was added, and the temperature was lowered to the room temperature to precipitate a solid. The obtained solid was washed with n-hexane and dried at room temperature, and thus 32 g of a yellow solid P1-B was obtained.

<Step 3>

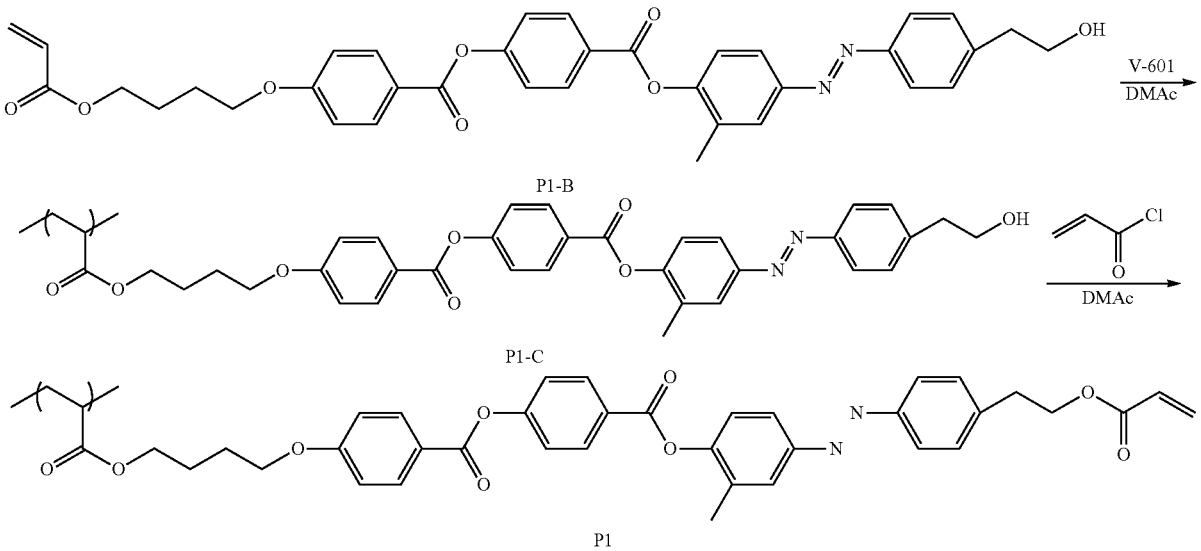

31.13 g of the yellow solid P1-B was dissolved in 125 mL of dimethylacetamide, and the resulting solution was stirred for 1 hour with nitrogen flowing thereto. The obtained solution was heated at an external temperature of 90° C., and 0.52 g of a polymerization initiator V-601 and 10 mL of a dimethylacetamide solution were added thereto and heated for 2 hours. The addition of the polymerization initiator and the heating for 2 hours at an external temperature of 90° C. were repeated two times to polymerize the yellow solid P1-B. After the end of the reaction, the reaction liquid was heated for 2 hours at 100° C. Then, the internal temperature of the reaction liquid was lowered to 60° C., and 125 mL of dimethylacetamide was added.

Next, the reaction liquid was cooled at an external temperature of 0° C., 0.2 g of 2,6-di-t-butyl-4-methylphenol was added, and 45.6 g of acrylic acid chloride was added dropwise at an internal temperature maintained at 15° C. or lower. After the reaction for 2 hours at room temperature, 500 mL of ethyl acetate was added, and the resulting liquid was added dropwise to 2,000 mL of methanol to precipitate a polymer solid. The polymer solid which had been filtered out was washed with methanol and dried at room temperature, and 31.6 g of a polymer compound P1 of a yellow solid was obtained. The obtained polymer compound P1 was analyzed by gel permeation chromatography (GPC). The number average molecular weight (Mn) was 9,000, and the weight average molecular weight (Mw) was 19,000 (all in terms of polystyrene).

Synthesis Example 2

[Synthesis of Polymer Compound P2]
A polymer compound P2 was synthesized in accordance with the following steps 1 to 3.

<Step 1>

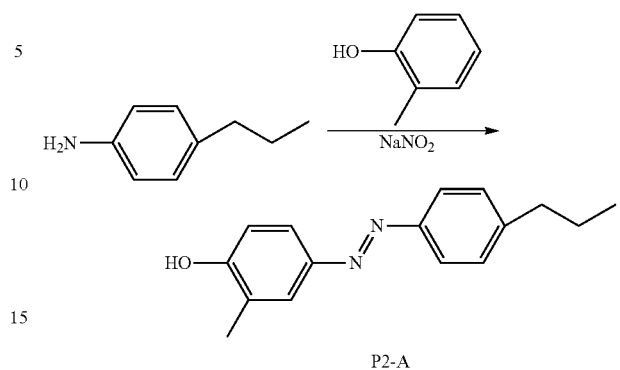

A yellow solid P2-A was synthesized in the same manner as in the synthesis of the yellow solid P1-A, except that 4-(2-hydroxyethyl)-aniline as a raw material was changed to 4-propylaniline.

<Step 2>

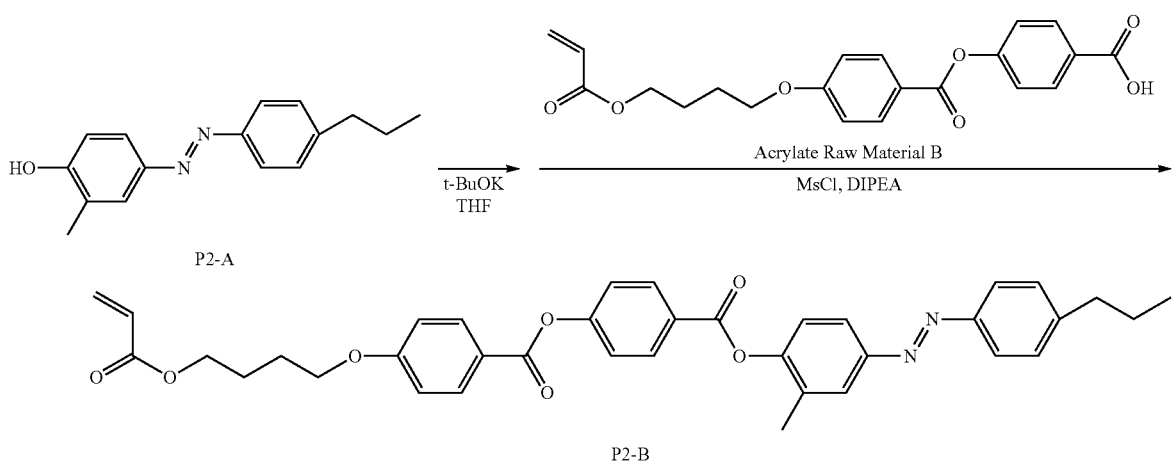

A yellow solid P2-B was synthesized in the same manner as in the synthesis of the yellow solid P1-B, except that the yellow solid P1-A as a raw material was changed to the yellow solid P2-A.

<Step 3>

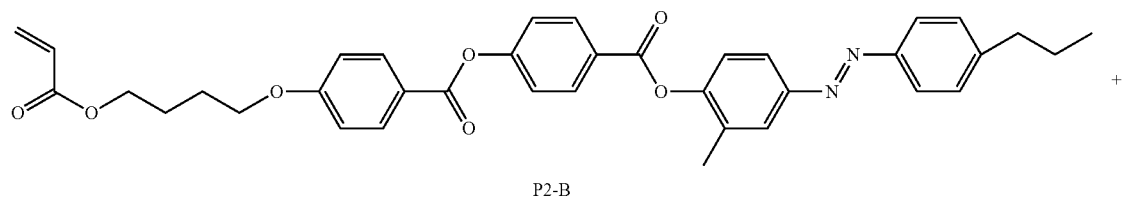

+

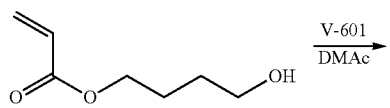

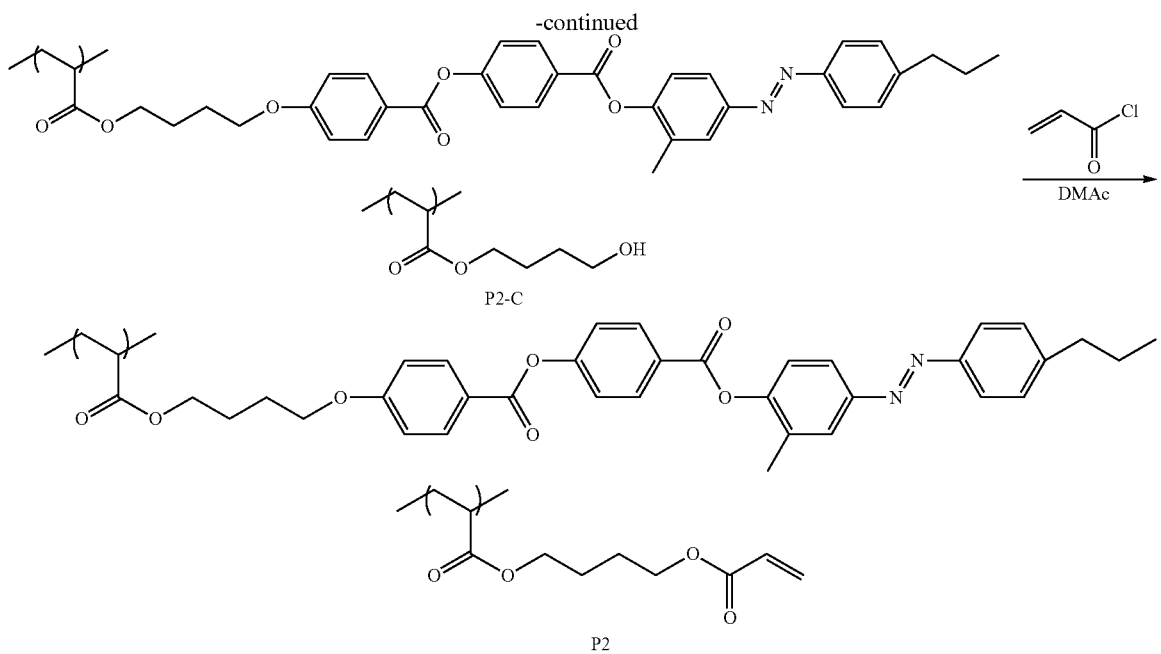

P2-C

P2

27.0 g of the yellow solid P2-B and 3.0 g of 4-hydroxybutyl acrylate were dissolved in 120 mL of dimethylacetamide, and the resulting solution was stirred for 1 hour with nitrogen flowing thereto. The obtained solution was heated at an external temperature of 90° C., and 0.55 g of a polymerization initiator V-601 and 10 mL of a dimethylacetamide solution were added thereto and heated for 2 hours. The addition of the polymerization initiator and the heating for 2 hours at an external temperature of 90° C. were repeated two times to polymerize the yellow solid P2-B and 4-hydroxybutyl acrylate. After the end of the reaction, the reaction liquid was heated for 2 hours at 100° C. Then, the internal temperature was lowered to 60° C., and 120 mL of dimethylacetamide was added.

Next, the reaction liquid was cooled at an external temperature of 0° C., 0.2 g of 2,6-di-t-butyl-4-methylphenol was added, and 12.5 g of acrylic acid chloride was added dropwise at an internal temperature maintained at 15° C. or lower. After the reaction for 2 hours at room temperature, 500 mL of ethyl acetate was added, and the resulting liquid was added dropwise to 2,000 mL of methanol to precipitate a polymer solid. The polymer solid which had been filtered out was washed with methanol and dried at room temperature, and 29.1 g of a polymer compound P2 of a yellow solid was obtained. The obtained polymer compound P2 was analyzed by gel permeation chromatography (GPC). The number average molecular weight (Mn) was 10,000, and the weight average molecular weight (Mw) was 23,000 (all in terms of polystyrene).

Synthesis Example 3

[Synthesis of Polymer Compound P3]

A polymer compound P3 was synthesized in accordance with the following step 1.

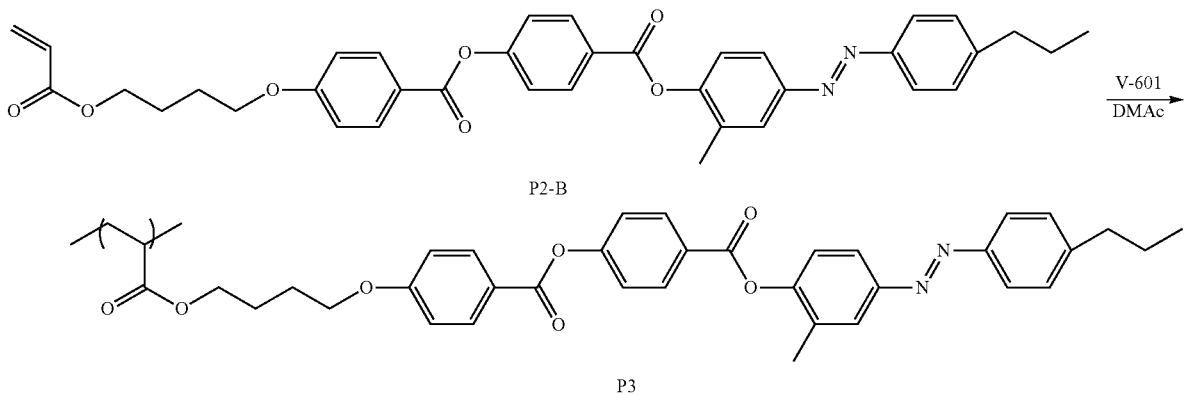

P2-B

P3

30 g of the yellow solid P2-B was dissolved in 120 mL of dimethylacetamide, and the resulting solution was stirred for 1 hour with nitrogen flowing thereto. The obtained solution was heated at an external temperature of 90° C., and 0.60 g of a polymerization initiator V-601 and 10 mL of a dimethylacetamide solution were added thereto and heated for 2 hours. The addition of the polymerization initiator and the heating for 2 hours at an external temperature of 90° C. were repeated two times to polymerize the yellow solid P2-B. After the end of the reaction, heating was performed for 2 hours at 100° C. Then, the internal temperature was lowered to 60° C., and 150 mL of ethyl acetate was added. The resulting liquid was added dropwise to 2,000 mL of methanol to precipitate a polymer solid. The polymer solid which had been filtered out was washed with methanol and dried at room temperature, and 29 g of a polymer compound P3 of a yellow solid was obtained. The obtained polymer compound P3 was analyzed by gel permeation chromatography (GPC). The number average molecular weight (Mn) was 6,600, and the weight average molecular weight (Mw) was 14,000 (all in terms of polystyrene).

Example 1

<Formation of Alignment Film>

A glass base (manufactured by Central Glass Co., Ltd., blue plate glass, size: 300 mm×300 mm, thickness: 1.1 mm) was washed with an alkaline detergent, and then pure water was poured thereto. After that, the glass base was dried.

The following alignment film forming composition 1 was applied to the glass base after the drying using a bar #12, and dried for 2 minutes at 110° C.

The obtained coating film was subjected to a rubbing treatment (1,000 rotations, stage speed: 1.8 m/min) once to form an alignment film 1 on the glass base.

Composition of Alignment Film Forming Composition 1

| Following Modified Polyvinyl Alcohol | 2.00 parts by mass |
|---|---|
| Water | 74.08 parts by mass |
| Methanol | 23.76 parts by mass |
| Photopolymerization Initiator (IRGACURE 2959, manufactured by BASF SE) | 0.06 parts by mass |

(Modified Polyvinyl Alcohol)

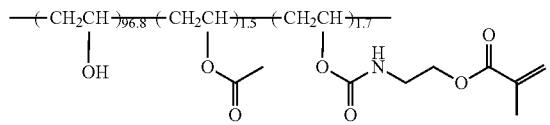

(in the formula, the numerical value assigned to the repeating unit represents a molar ratio of each repeating unit.)

<Production of Light Absorption Anisotropic Film>

The obtained alignment film 1 was spin-coated with the following coloring composition 1 by 1,000 rotations to form a coating film.

The coating film was dried for 30 seconds at room temperature, and then further heated for 15 seconds at 180° C.

Next, the coating film was cooled to the room temperature, and then irradiation was performed thereon using a high-pressure mercury lamp at 80° C. for 60 seconds under an irradiation condition of 28 mW/cm$^2$ illuminance to produce a light absorption anisotropic film 1 on the alignment film 1.

Composition of Coloring Composition 1

| Following Polymer Compound P1 | 2.95 parts by mass |
|---|---|
| Following Dichroic Dye Compound D1 | 1.33 parts by mass |
| Following Dichroic Dye Compound D2 | 0.53 parts by mass |
| Following Dichroic Dye Compound D3 | 0.80 parts by mass |
| Following Interface Improver F1 | 0.02 parts by mass |
| Polymerization Initiator Irg-819 (manufactured by BASF SE) | 0.17 parts by mass |
| Chloroform | 94.20 parts by mass |

In the chloroform, the maximum absorption wavelengths of the polymer compound P1, the dichroic dye compound D1, the dichroic dye compound D2, and the dichroic dye compound D3 were 333 nm, 448 nm, 591 nm, and 618 nm, respectively.

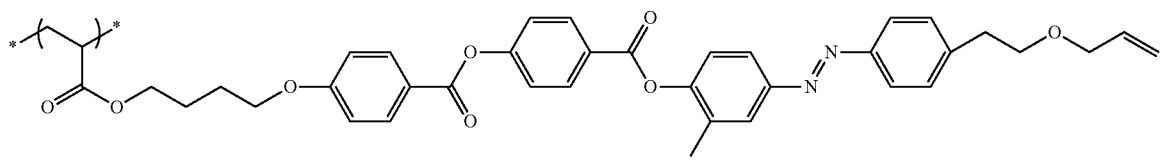

P1

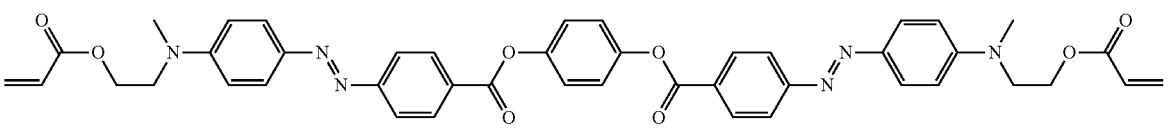

D1

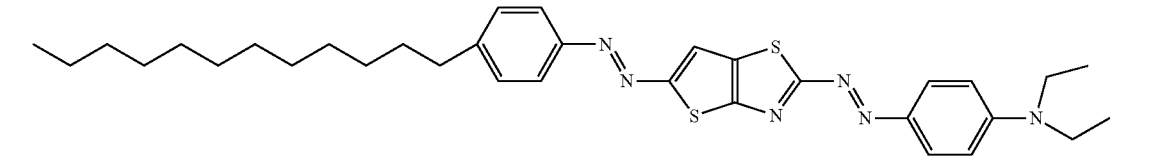

D2

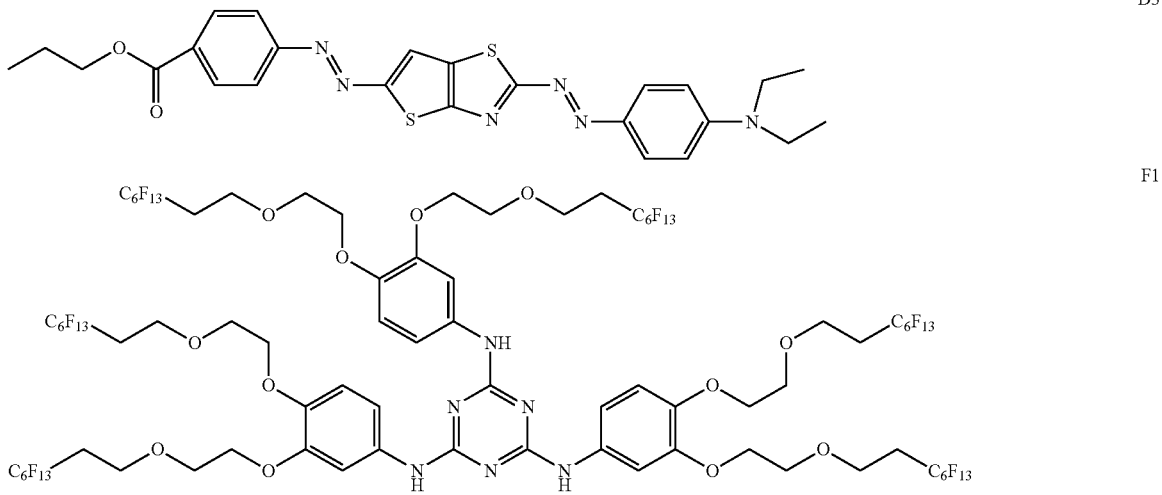

D3

F1

Example 2

<Formation of Alignment Film>

A glass base (manufactured by Central Glass Co., Ltd., blue plate glass, size: 300 mm×300 mm, thickness: 1.1 mm) was washed with an alkaline detergent, and then pure water was poured thereto. After that, the glass base was dried.

The following alignment film forming composition 2 was applied to the glass base after the drying using a bar #4. The applied alignment film forming composition 2 was dried for 15 minutes at 80° C., and then heated for 1 hour at 250° C. to form a coating film on the glass base.

The obtained coating film was subjected to a rubbing treatment (1,000 rotations, stage speed: 1.8 m/min) once to form an alignment film 2 on the glass base.

Composition of Alignment Film Forming Composition 2

| | |
|---|---|
| SE-130 (product name, manufactured by Nissan Chemical Industries, Ltd.) | 2.0 parts by mass |
| N-Methylpyrrolidone | 98.0 parts by mass |

<Production of Light Absorption Anisotropic Film>

The obtained alignment film 2 was spin-coated with the following coloring composition 2 by 500 rotations to form a coating film.

The coating film was dried for 30 seconds at room temperature, and then further heated for 15 seconds at 160° C.

Next, the coating film was cooled to the room temperature, and then irradiation was performed thereon using a high-pressure mercury lamp at 80° C. for 60 seconds under an irradiation condition of 28 mW/cm$^2$ illuminance to produce a light absorption anisotropic film 2 on the alignment film 2.

Composition of Coloring Composition 2

| | |
|---|---|
| Above-Described Polymer Compound P1 | 3.03 parts by mass |
| Following Dichroic Dye Compound D4 | 1.21 parts by mass |
| Following Dichroic Dye Compound D5 | 1.09 parts by mass |
| Following Dichroic Dye Compound D6 | 1.04 parts by mass |
| Above-Described Interface Improver F1 | 0.02 parts by mass |
| Polymerization Initiator Irg-819 (manufactured by BASF SE) | 0.23 parts by mass |
| Cyclopentanone (hereinafter, abbreviated as "CPO") | 93.00 parts by mass |

In the CPO, the maximum absorption wavelengths of the polymer compound P1, the dichroic dye compound D4, the dichroic dye compound D5, and the dichroic dye compound D6 were 335 nm, 420 nm, 590 nm, and 603 nm, respectively.

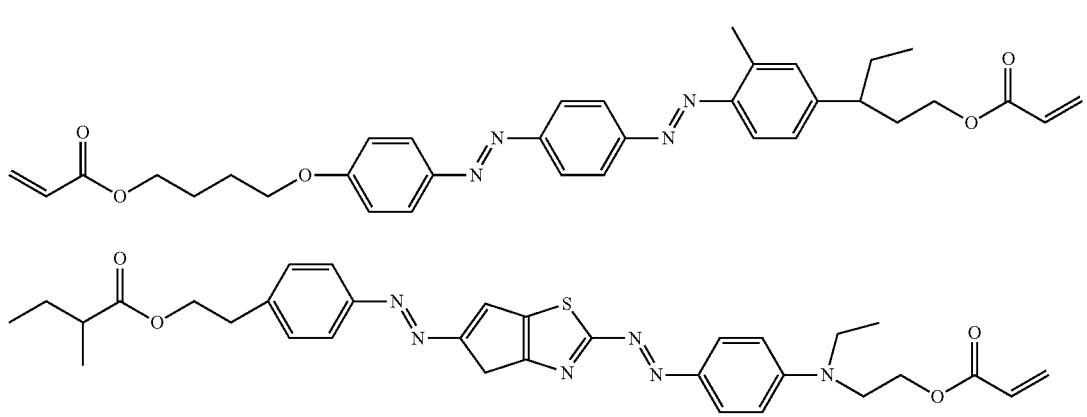

D4

D5

-continued

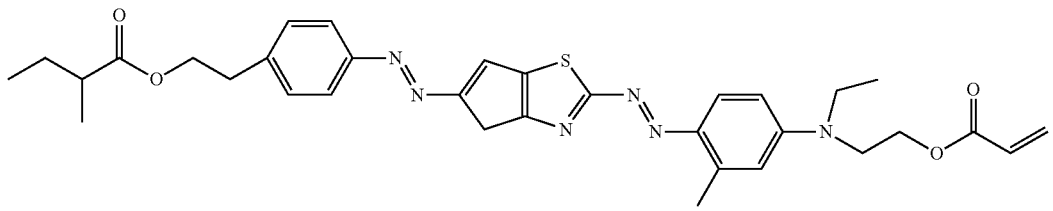
D6

Examples 3 to 5, 7, 8, 10, and 11 and Comparative Examples 1 to 3

A light absorption anisotropic film was produced on the alignment film 1 in the same manner as in Example 1, except that the kinds or contents of the polymer compound, the dichroic dye compound, the polymerization initiator, the interface improver, and the solvent in the coloring composition were changed as shown in the following Table 1. In Example 4 and Comparative Example 2, a polyethylene terephthalate (PET) film (COSMOSHINE, manufactured by TOYOBO CO., LTD.) was used instead of the glass base.

Examples 6 and 9

A light absorption anisotropic film was produced on the alignment film 2 in the same manner as in Example 2, except that the kinds or contents of the polymer compound, the dichroic dye compound, the polymerization initiator, the interface improver, and the solvent in the coloring composition were changed as shown in the following Table 1.

[Evaluation]
<Dichroic Ratio>

In a state in which a linear polarizer was inserted on the light source side of an optical microscope (manufactured by Nikon Corporation, product name "ECLIPS E600 POL"), the light absorption anisotropic film of each of the examples and the comparative examples was set on a sample table, and using a multi-channel spectroscope (manufactured by Ocean Optics, Inc., product name "QE65000"), an absorbance of the light absorption anisotropic film in a wavelength band of 400 to 700 nm was measured to calculate a dichroic ratio by the following formula. The results are shown in the following Table 1. In a case where the dichroic ratio is 15.0 or greater, the light absorption anisotropic film can be evaluated to maintain an excellent dichroic ratio.

Dichroic Ratio $(D0)=Az0/Ay0$

In the above formula, "$Az0$" represents an absorbance with respect to the polarization in an absorption axis direction of the light absorption anisotropic film. "$Ay0$" represents an absorbance with respect to the polarization in a polarization axis direction of the light absorption anisotropic film.

<Pressing Resistance>

The light absorption anisotropic film of each of the examples and the comparative examples was pressed by a finger, and a pressed portion was visually observed for evaluation based on the following standards. The results are shown in the following Table 1.

A: Color change, scratches, or the like are not shown at all.
B: Slight color change, scratches, or the like are shown.
C: Color change, scratches, or the like are shown.

TABLE 1

|  | Example 1 | Example 2 | Example 3 | Example 4 | Example 5 | Example 6 | Example 7 |
|---|---|---|---|---|---|---|---|
| Support | Glass | Glass | Glass | PET | Glass | Glass | Glass |
| Alignment Film | Composition 1 | Composition 2 | Composition 1 | Composition 1 | Composition 1 | Composition 2 | Composition 1 |
| Polymer | P1 | P1 | P1 | P2 | P1 | P1 | P1 |
| Compound | 2.95 | 3.03 | 3.58 | 3.31 | 4.93 | 4.97 | 5.91 |
| Dichroic Dye | D1 | D4 | D4 | D4 | D4 | | |
| Compound | 1.33 | 1.21 | 1.40 | 1.09 | 1.74 | | |
|  | D2 | D5 | D7 | D5 | | D7 | D7 |
|  | 0.53 | 1.09 | 1.72 | 0.99 | | 1.72 | 0.89 |
|  | D3 | D6 | | D6 | | | |
|  | 0.80 | 1.04 | | 1.37 | | | |
| Polymerization Initiator | Irg-819 | Irg-819 | Irg-819 | Irg-819 | Irg-819 | Irg-819 | Irg-819 |
|  | 0.17 | 0.23 | 0.28 | 0.22 | 0.29 | 0.28 | 0.18 |
| Interface Improver | F1 | F1 | F1 | F1 | F1 | F1 | F1 |
|  | 0.02 | 0.02 | 0.03 | 0.02 | 0.03 | 0.03 | 0.02 |
| Solvent | Chloroform | CPO | CPO | CPO | CPO | CPO | Chloroform |
|  | 94.20 | 93.00 | 93.00 | 93.00 | 93.00 | 93.00 | 93.00 |
| Dichroic Ratio | 23.0 | 36.0 | 40.3 | 28.0 | 20.2 | 48.0 | 19.4 |
| Pressing Resistance | B | A | B | A | A | B | B |

|  | Example 8 | Example 9 | Example 10 | Example 11 | Comparative Example 1 | Comparative Example 2 | Comparative Example 3 |
|---|---|---|---|---|---|---|---|
| Support | Glass | Glass | Glass | Glass | Glass | PET | Glass |
| Alignment Film | Composition 1 | Composition 2 | Composition 1 | Composition 1 | Composition 1 | Composition 1 | Composition 1 |
| Polymer | P4 | P4 | P6 | P7 | P3 | P5 | P8 |
| Compound | 5.91 | 4.96 | 3.40 | 3.40 | 2.95 | 2.97 | 2.95 |
| Dichroic Dye | | | | | D1 | D4 | D4 |

TABLE 1-continued

| Compound | | | | | 1.33 | 1.25 | 0.84 |
|---|---|---|---|---|---|---|---|
| | D8 | D8 | D5 | D5 | D2 | D5 | D2 |
| | 0.89 | 1.72 | 0.99 | 0.99 | 0.53 | 1.05 | 0.74 |
| | | | D6 | D6 | D3 | D6 | D7 |
| | | | 1.19 | 1.19 | 0.80 | 1.47 | 1.08 |
| Polymerization Initiator | Irg-819 0.18 | Irg-819 0.28 | Irg-819 0.20 | Irg-819 0.20 | Irg-819 0.17 | Irg-819 0.23 | Irg-819 0.17 |
| Interface Improver | F1 0.02 | F1 0.04 | F1 0.02 | F1 0.02 | F1 0.02 | F1 0.02 | F1 0.02 |
| Solvent | Chloroform 93.00 | CPO 93.00 | Chloroform 94.20 | Chloroform 94.20 | Chloroform 94.20 | CPO 93.00 | Chloroform 94.20 |
| Dichroic Ratio | 15.6 | 19.1 | 15.1 | 15.0 | 23.0 | 18.1 | 12.9 |
| Pressing Resistance | B | B | B | B | C | C | B |

In the above Table 1, the structural formulae of the polymer compounds P2 to P8 and dichroic dye compounds D7 and D8 are as follows.

The polymer compound P4 (Mn: 8,000, Mw: 16,500), the polymer compound P5 (Mn: 9,500, Mw: 16,500), the polymer compound P6 (Mn: 12,000, Mw: 23,000), the polymer compound P7 (Mn: 10,000, Mw: 19,500), and the polymer compound P8 (Mn: 11,000, Mw: 22,000) can be synthesized by the same synthesis method as in the cases of the above-described polymer compounds P1 to P3.

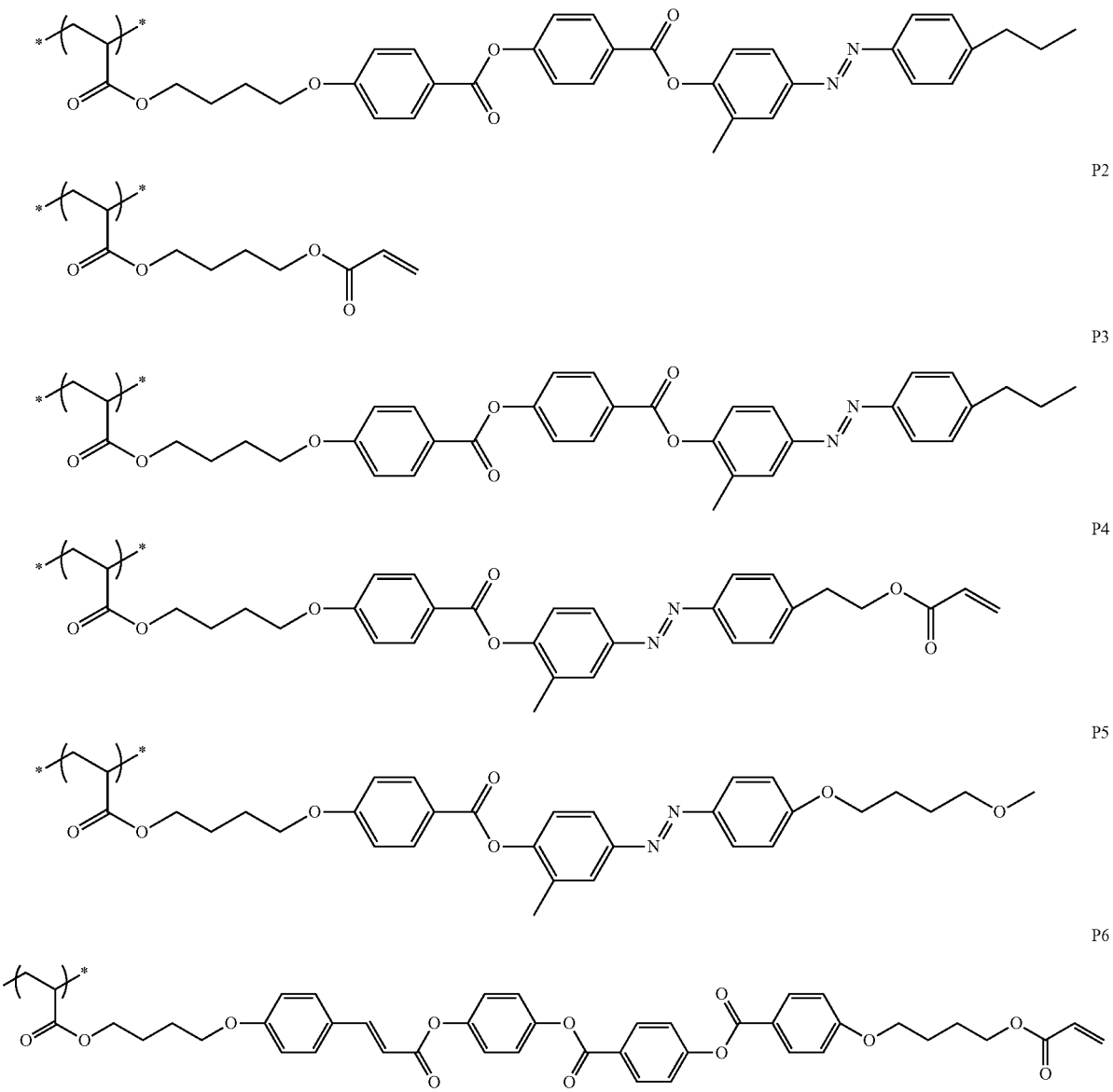

-continued

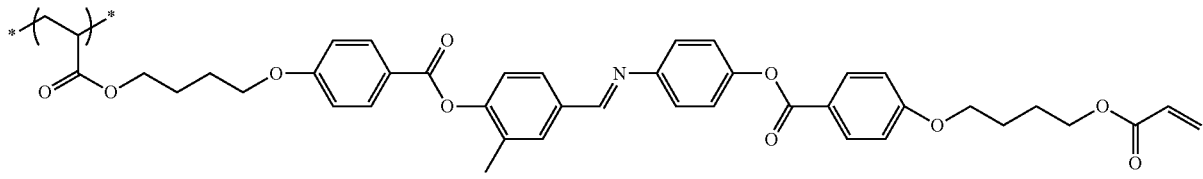
P7

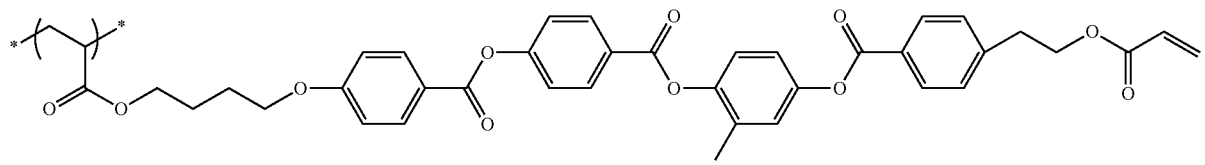
P8

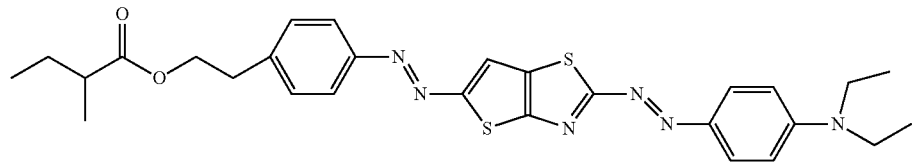
D7

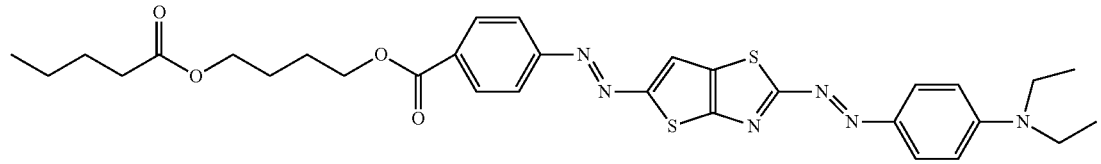
D8

From the results shown in Table 1, it has been found that the pressing resistance of the light absorption anisotropic film deteriorates in a case where a polymer compound having no crosslinkable group in a side chain of a repeating unit is used (Comparative Examples 1 and 2).

In addition, it has been found that even in a case where a crosslinkable group is provided in a side chain of a repeating unit, an excellent dichroic ratio cannot be maintained in a case where a predetermined structure such as an azo group is not included in a mesogenic group (Comparative Example 3).

On the contrary, it has been found that in a case where a polymer compound having a repeating unit including a crosslinkable group and a mesogenic group in the same side chain, or a polymer compound separately having a repeating unit including a crosslinkable group in a side chain and a repeating unit including a mesogenic group in a side chain is used, the light absorption anisotropic film maintains an excellent dichroic ratio, and good pressing resistance is obtained (Examples 1 to 11).

In addition, from the comparison between Examples 1 and 2, it has been found that a light absorption anisotropic film in which the amount of the dichroic dye compound having a crosslinkable group is larger has further improved pressing resistance.

In addition, from the comparison between Examples 6 and 7, it has been found that a light absorption anisotropic film in which the content of the dichroic dye compound is larger is more likely to maintain an excellent dichroic ratio.

In addition, from the comparison between Examples 7 and 8 and the comparison between Examples 6 and 9, it has been found that a light absorption anisotropic film in which the number of benzene rings included in the mesogenic group is larger is more likely to maintain an excellent dichroic ratio.

What is claimed is:

1. A coloring composition comprising:
a polymer compound having a repeating unit represented by Formula (1) and
a dichroic dye compound,

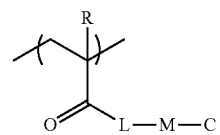
(1)

in Formula (1), R represents a hydrogen atom or a methyl group, L represents a single bond or a divalent linking group, C represents an acryloyl group or a methacryloyl group, and M represents a mesogenic group represented by Formula (1-1),

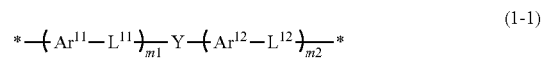
(1-1)

in Formula (1-1), $Ar^{11}$ and $Ar^{12}$ each independently represent a phenylene group or a biphenylene group which may have a substituent, $L^{11}$ and $L^{12}$ each independently represent a single bond or a divalent linking group, Y represents an azo group, an imino group, a —OCO—CH=CH— group, or a —CH=CH—CO$_2$— group, and m1 and m2 each independently represent an integer of 1 to 3, wherein in a case where m1 is an integer of 2 or 3, plural $Ar^{11}$'s may be the same or different, and plural $L^{11}$'s may be the same or different, and in a case where m2 is an integer of 2 or 3, plural $Ar^{12}$'s may be the same or different, and plural $L^{12}$'s may be the same or different.

2. The coloring composition according to claim 1,
wherein the polymer compound has a maximum absorption wavelength of 380 nm or less.

3. The coloring composition according to claim 1,
wherein the dichroic dye compound includes at least one kind of dye compound having a maximum absorption wavelength within a wavelength range of 370 to 550 nm and at least one kind of dye compound having a maximum absorption wavelength within a wavelength range of 500 to 700 nm.

4. The coloring composition according to claim 1,
wherein the dichroic dye compound has a crosslinkable group.

5. The coloring composition according to claim 1,
wherein the content of the dichroic dye compound is 5 to 300 parts by mass with respect to 100 parts by mass of the polymer compound.

6. The coloring composition according to claim 1,
wherein the number of benzene rings included in the mesogenic group of the polymer compound is 3 or more.

7. A light absorption anisotropic film which is formed using the coloring composition according to claim 1.

8. A laminate comprising:
a base; and
the light absorption anisotropic film according to claim 7 which is provided on the base.

9. The laminate according to claim 8, further comprising:
a λ/4 plate which is provided on the light absorption anisotropic film.

10. An image display device comprising:
the light absorption anisotropic film according to claim 7.

11. The coloring composition according to claim 2,
wherein the dichroic dye compound includes at least one kind of dye compound having a maximum absorption wavelength within a wavelength range of 370 to 550 nm and at least one kind of dye compound having a maximum absorption wavelength within a wavelength range of 500 to 700 nm.

12. The coloring composition according to claim 2,
wherein the dichroic dye compound has a crosslinkable group.

13. The coloring composition according to claim 3,
wherein the dichroic dye compound has a crosslinkable group.

14. The coloring composition according to claim 2,
wherein the content of the dichroic dye compound is 5 to 300 parts by mass with respect to 100 parts by mass of the polymer compound.

15. The coloring composition according to claim 3,
wherein the content of the dichroic dye compound is 5 to 300 parts by mass with respect to 100 parts by mass of the polymer compound.

16. The coloring composition according to claim 4,
wherein the content of the dichroic dye compound is 5 to 300 parts by mass with respect to 100 parts by mass of the polymer compound.

17. The coloring composition according to claim 2,
wherein the number of benzene rings included in the mesogenic group of the polymer compound is 3 or more.

18. The coloring composition according to claim 3,
wherein the number of benzene rings included in the mesogenic group of the polymer compound is 3 or more.

19. An image display device comprising:
the laminate according to claim 8.

20. An image display device comprising:
the laminate according to claim 9.

* * * * *